United States Patent [19]
Abraham et al.

[11] Patent Number: 5,907,246
[45] Date of Patent: May 25, 1999

[54] TESTING OF SEMICONDUCTOR CHIPS

[75] Inventors: Bruce C. Abraham, Limekiln; Patrick J. Drummond, Hamburg, both of Pa.

[73] Assignee: Lucent Technologies, Inc., Murray Hill, N.J.

[21] Appl. No.: 08/564,613

[22] Filed: Nov. 29, 1995

[51] Int. Cl.$^6$ .................................................. G01R 31/02
[52] U.S. Cl. .......................................... 324/760; 324/754
[58] Field of Search .................... 324/760, 73.1, 324/158.1, 754

[56] References Cited

U.S. PATENT DOCUMENTS

| | | | |
|---|---|---|---|
| 3,710,251 | 1/1973 | Hagge et al. ........................... | 324/760 |
| 3,949,295 | 4/1976 | Moorshead .............................. | 324/760 |
| 4,115,736 | 9/1978 | Tracy ....................................... | 324/760 |
| 5,012,187 | 4/1991 | Littlebury ................................. | 324/754 |
| 5,210,485 | 5/1993 | Kreiger et al. .......................... | 324/758 |
| 5,397,997 | 3/1995 | Tuckerman et al. .................... | 324/754 |
| 5,523,696 | 6/1996 | Charlton et al. ........................ | 324/758 |

*Primary Examiner*—Ernest F. Karlsen
*Attorney, Agent, or Firm*—Morgan & Finnegan, LLP

[57] ABSTRACT

A method and apparatus for testing of semiconductor chips. The method and apparatus having a fixture which includes electrical contacts and thermal contacts. The electrical contacts are configured to drive each of the chips in an operating or stressed condition. The thermal contacts are configured to maintain the chip at a desired temperature during testing.

43 Claims, 16 Drawing Sheets

TESTING OF SEMICONDUCTOR CHIPS

FIELD OF THE INVENTION

The invention relates to a method and apparatus for testing of semiconductor chips and, in particular, laser chips.

BACKGROUND OF THE INVENTION

Semiconductor chips are tested for defects after their fabrication and before sale or installation in an optoelectronic module. In one known method of testing, a laser chip is mounted to a submount/heat sink, the chip-on-submount assembly is bonded to a metal stud to facilitate handling, the chip-on-submount assembly with its stud is mounted in a temperature controlled environment and the chip is contacted with electrodes carrying electrical current to perform a purge test. In that test method, those operations are performed by human operators.

That known approach to testing of semiconductor chips has considerable disadvantages. Because each semiconductor chip is tested individually, the testing is time consuming and costly. Moreover, because semiconductor chips are tested by a human operator, the quality and consistency of the testing, and, in particular, the thermal contact of the chip and submount/heat sink and the electrical contact of chip and the electrodes, vary greatly and depend on the ability of the operator. Thus, there exists a need in the art for an efficient, automated method and apparatus for consistently and reliably testing semiconductor chips without dependence on consistency of a human operator.

SUMMARY OF THE INVENTION

The above problems are solved in accordance with the present invention by providing a method and apparatus for testing of semiconductor chips and, in particular, laser chips. The invention allows for simultaneous, automated testing of mass quantities of semiconductor chips and thereby greatly reduces the time and costs associated with post-fabrication quality assurance testing.

Generally, the invention provides a fixture for thermally-controlled testing of semiconductor chips and, in particular, laser chips. The fixture includes thermal contacts that maintain the chips at a desired temperature during testing and electrodes that carry electrical current to test the chips in an operating or stressed condition.

The preferred embodiment of the invention provides for mounting of semiconductor chips to submounts, loading the semiconductor chip-on-submount ("COS") assemblies into pockets formed in a waffle-type tray and securing the tray in a fixture for testing the chips. The fixture includes a spring-loaded frame, temperature controlled pins for regulating the temperature of the semiconductor chips during testing, a base and a head. The base secures the temperature controlled pins and forms a vessel having a hollow interior for receiving a temperature controlled liquid. The temperature controlled pins extend into the hollow interior of the vessel and contact the temperature controlled liquid so that the temperature of the temperature controlled pins is regulated. The head includes electrodes that carry electrical current to test the chips.

In operation, the tray is loaded with COS assemblies and is placed in the spring loaded frame. The spring loaded frame holds the tray and the COS assemblies therein slightly above the temperature controlled pins in the base and slightly below the electrodes in the head. The fixture is then locked. Upon locking, the head pushes down on the spring loaded frame causing (a) the temperature controlled pins to contact the COS assemblies and lift them above the tray and (b) the electrodes to contact the semiconductor chips. The electrodes drive the semiconductor chips at operational or stressed conditions by transferring electrical current to the chips so that the chips can be tested in accordance with established testing protocols. Upon completion of the testing of the semiconductor chips, the fixture is unlocked, the tray removed and the COS assemblies unloaded from the tray.

During testing of the semiconductor chips, the temperature of the chips is regulated by the interaction of the COS assemblies and the temperature controlled pins. Specifically, heat generated by the semiconductor chips during testing is transferred through the submount/heat sink to the temperature controlled pins and through the temperature controlled pins to the temperature controlled liquid circulating through the hollow interior of the vessel. For a purge test, the temperature of the COS assemblies is maintained at about $100\pm1°$ C.

To further facilitate temperature control of the semiconductor chips during testing, the vessel may be designed with ports that are configured to circulate the temperature controlled fluid relatively uniformly throughout the vessel. In addition, the portions of the temperature controlled pins that extend into the vessel interior and contact with the temperature controlled fluid may be designed to increase the surface area of the pins in contact with the fluid and thereby increase the thermal exchange between the pins and the fluid. Finally, the portion of the temperature controlled pins in contact with the semiconductor chip may have a vacuum-drawing pore to insure a good contact between the chips and pins.

By obviating the need for mounting semiconductor chips on submounts having studs, the invention allows for various automated handling opportunities for testing semiconductor chips not possible with "stud-mounting" that will be apparent to persons having ordinary skill in the art. Moreover, as will be apparent to persons skilled in the art, the invention finds application both in thermally-controlled testing of semiconductor chips and also in fabrication. The fixture can be used to cool chips or to heat them for testing (i.e. to test chips at both ends of their specified temperature ranges). The invention can also be used for other, nontesting operations. For example, chips may be simultaneously bonded to a substrate by using the device to heat the bonding sites of the substrate. Other features and advantages of the invention will be apparent to persons skilled in the art from the drawings, detailed description and claims.

BRIEF DESCRIPTION OF THE DRAWINGS

FIG. 3b is a side view of the subassembly of the embodiment of the test fixture shown in FIG. 3a.

FIG. 4b is a side view of the component the embodiment of the test fixture shown in FIG. 4a.

FIG. 5b is a side, cut away view of the embodiment of the tray shown in FIG. 5a.

FIG. 5c is a detail view of the embodiment of the tray shown in FIG. 5a.

FIG. 16b is a schematic diagram showing the positions of the chips tested and plotted in FIG. 16a.

DETAILED DESCRIPTION

Figure 1:
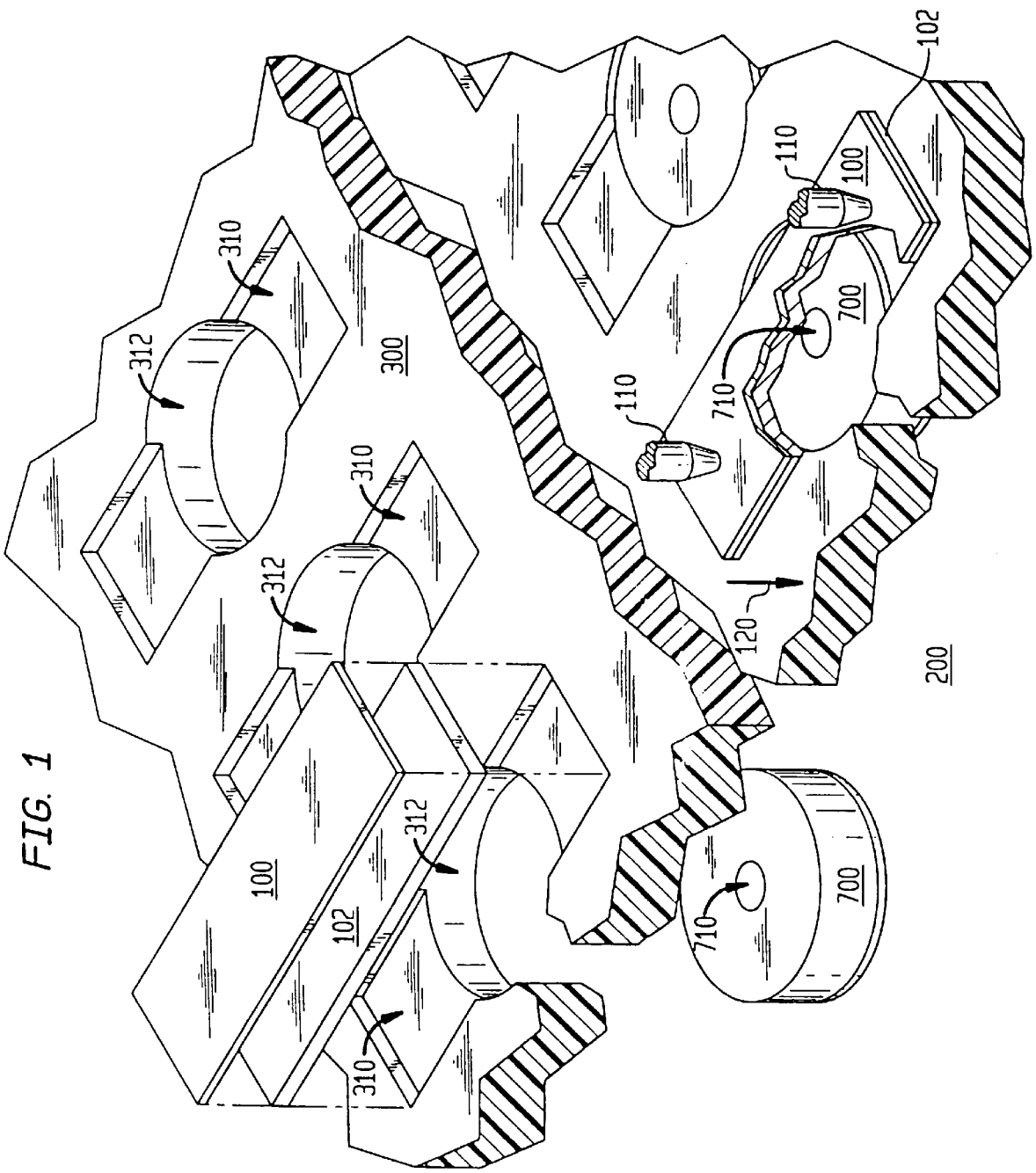
FIG. 1 is a perspective, exploded, partially cut away view of an embodiment of a test fixture of the invention.
Figure 2A:
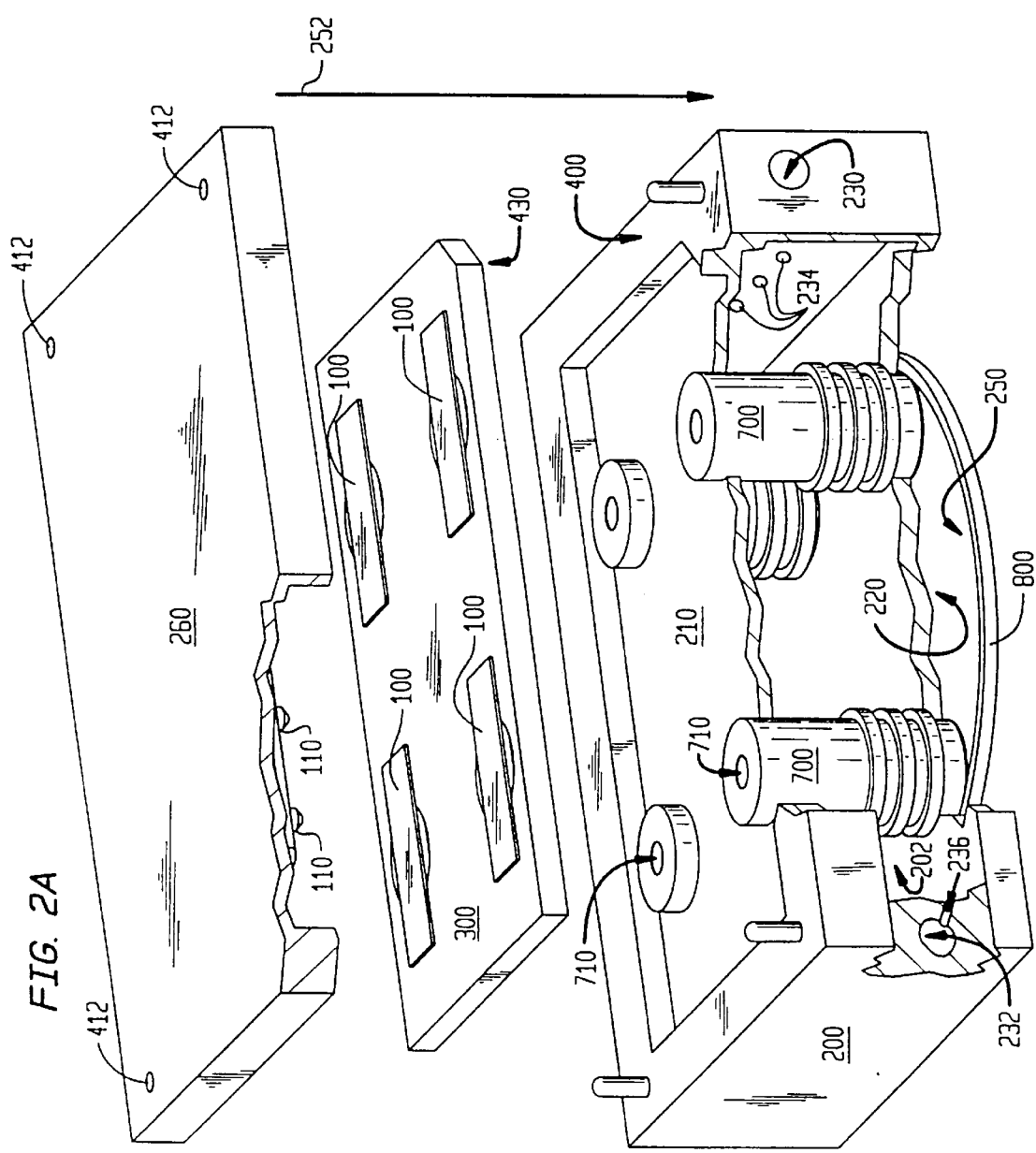
FIG. 2a is a perspective view, partially cut away, of an embodiment of the test fixture of the invention.

Referring to FIG. 1, a semiconductor chip 100, bonded to a submount 102, is tested by being driven at operational or stressed conditions by electrical contacts or electrodes 110. During testing, the temperature of chip-on-submount assembly ("COS") 100, 102 is regulated through contact with temperature controlled pins 700. Temperature controlled pins 700 have pores 710 extending end-to-end. A vacuum is drawn through pores 710 in the temperature controlled pins 700 to hold the COS assemblies in place as the electrodes 110 are brought into to contact with COS assemblies 100, 102. The temperature controlled pins 700 are secured to a base. The base includes a vessel 200 having a hollow interior cavity 202 (FIG. 2a). The temperature controlled pins extend into the hollow interior cavity 202 of vessel 200. Within the hollow interior cavity 202 of vessel 200 circulates a fluid that maintains the temperature controlled pins 700 at the desired temperature.

For ease of handling, a number of COS assemblies 100, 102 are placed in rectangular pockets 310 of a waffle-pack tray 300. Tray 300 may have, for example, one hundred of these pockets arranged in a 10×10 array. Each of the rectangular pockets 310 has a cylindrical hole 312 extending through tray 300, so that temperature controlled pins 700 can extend through holes 312 in the tray 300 to contact the COS assemblies 100, 102. As will be explained more fully below with respect to FIGS. 10–12, during testing of the chips, tray 300 is pressed down in the direction of arrow 120. When the tray 300 is pressed down, COS assemblies 100, 102 are lifted out of the pockets 310 such that the thermal contact between temperature controlled pins 700 and the COS assemblies 100, 102 is increased and any thermal exchange between adjacent semiconductor chips 100 through the tray 300 is reduced.

Figure 2B:
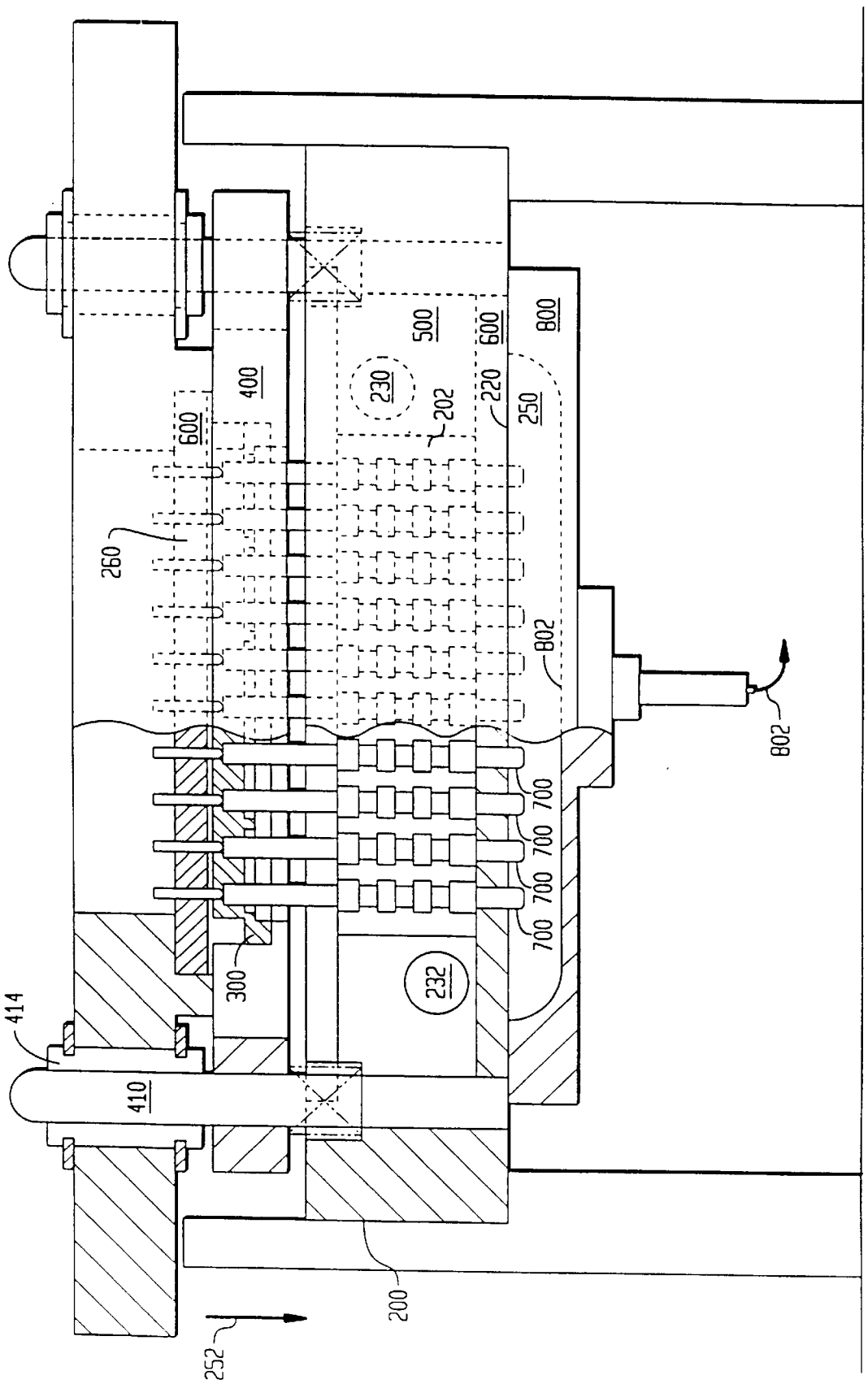
FIG. 2b is a side view, partially cut away, of an embodiment of the test fixture of the invention.
Figure 3A:
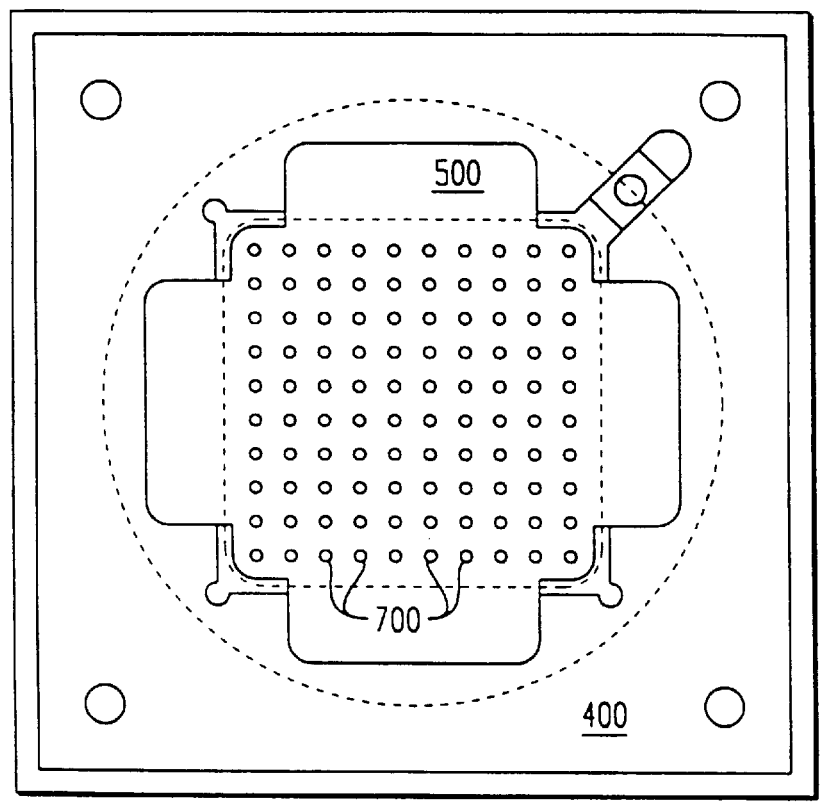
FIG. 3a is a plan view of a subassembly of the test fixture shown in FIG. 2b.
Figure 3B:
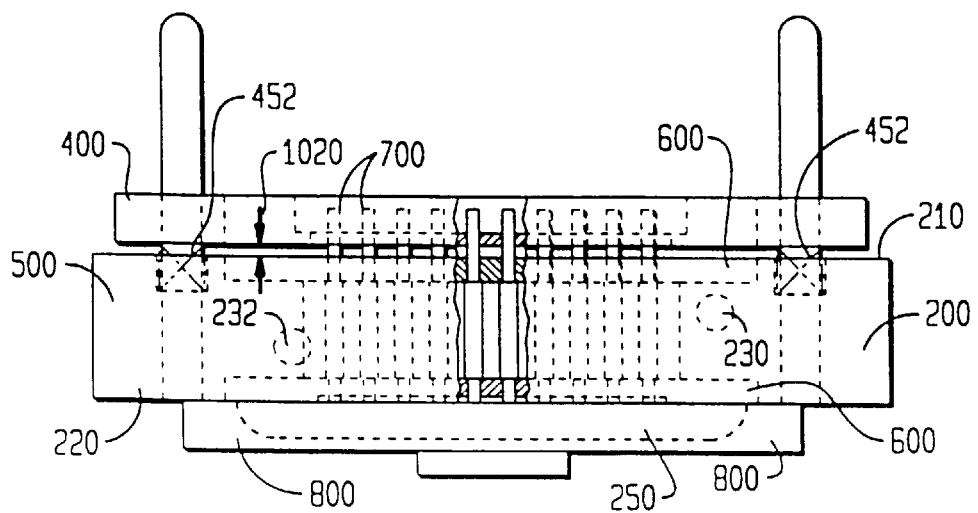

FIGS. 2a and 2b show embodiments of a test fixture according to the invention. FIG. 2a shows a simplified 2×2 embodiment and FIG. 2b shows a 10×10 embodiment (having an overall size of approximately 2 inches×2 inches) that would more typically be used commercially. FIGS. 3a and 3b show subassemblies of the embodiment of the test fixture of the invention shown in FIGS. 2a and 2b.

Referring to FIGS. 2a, 2b, 3a and 3b, vessel 200 is formed as a rectangular block having an interior hollow cavity 202. Temperature controlled pins 700 extend through the cavity and protrude through the top 210 and bottom 220 surfaces of the vessel 200. Along the sides of the vessel are two ports 230, 232, with smaller ducts 234, 236 extending into cavity 202 of the vessel 200 to facilitate flow of a temperature controlled liquid through the hollow interior cavity 202 of the vessel 200. Vessel 200 is preferably formed of a machinable polyamide plastic that has good temperature stability. Such a material is available from E. I. du Pont & Co. of Wilmington, Del. under the tradename Vespel®. Such a material insulates temperature controlled pins 700 from each other (in contrast to a vessel made of a conductive material such as stainless steel) so that uniformity of temperature of the pins 700 is improved.

The temperature of temperature controlled pins 700 is maintained by circulating a temperature controlled liquid or coolant, for example a silicon based fluid or ethylene glycol, through the hollow cavity 202. The temperature controlled liquid enters the vessel cavity 202 through the upper right port 230 and upper right ducts 234, passes through vessel cavity 202, and leaves the vessel cavity 202 through lower left ducts 236 and lower left port 232. The ducts 234, 236 are preferably uniformly spaced along the lower left and upper right edges of the vessel cavity 202, so that the temperature controlled liquid preferably moves through the vessel cavity 202 in a nearly uniform way, with little swirling and relatively small differences in temperature controlled liquid velocity over the entire vessel cavity 202 space. Preferably the temperature controlled liquid is circulated by a liquid control bath circulator. A suitable liquid control bath circulator is available from Neslab Instruments, Inc. of Portsmouth, N.H.

The vacuum drawn through pores 710 in the temperature controlled pins 700 to hold the COS assemblies 100, 102 to the pins 700 is maintained by a vacuum cavity 250 between a bottom cover plate 800 and the bottom surface 220 of vessel 200. A hole in the center of the bottom cover plate 800 is connected to a vacuum pump.

Electrodes 110 are mounted in a test head 260 that can be lowered in the direction of arrow 252 to bring electrodes 110 into contact with chips 100 for testing, and raised in the opposite direction to bring electrodes 110 out of contact with the chips when testing is complete. Electrodes 110 for contacting a single chip are preferably 0.07 inches apart. Electrodes 110 are preferably spring contacts, with a plunger of gold-plated beryllium copper and a body of gold-plated brass. The spring force is preferably 0.75 ounces initially, and 1.5 ounces at full depression of 0.030 inches. Suitable electrodes are available from Speccon, Inc. of North Attleboro, Mass. Test head 260 includes cable connectors for the voltage supply, resistors and possibly a thermocouple used to maintain the operating or stressed condition. Other electronics, to measure the current draw, voltage and light output of the chips may either be mounted in close proximity to the test head 260 or may be part of the next station in the test line, where the chips are tested without being stressed.

Figure 4A:
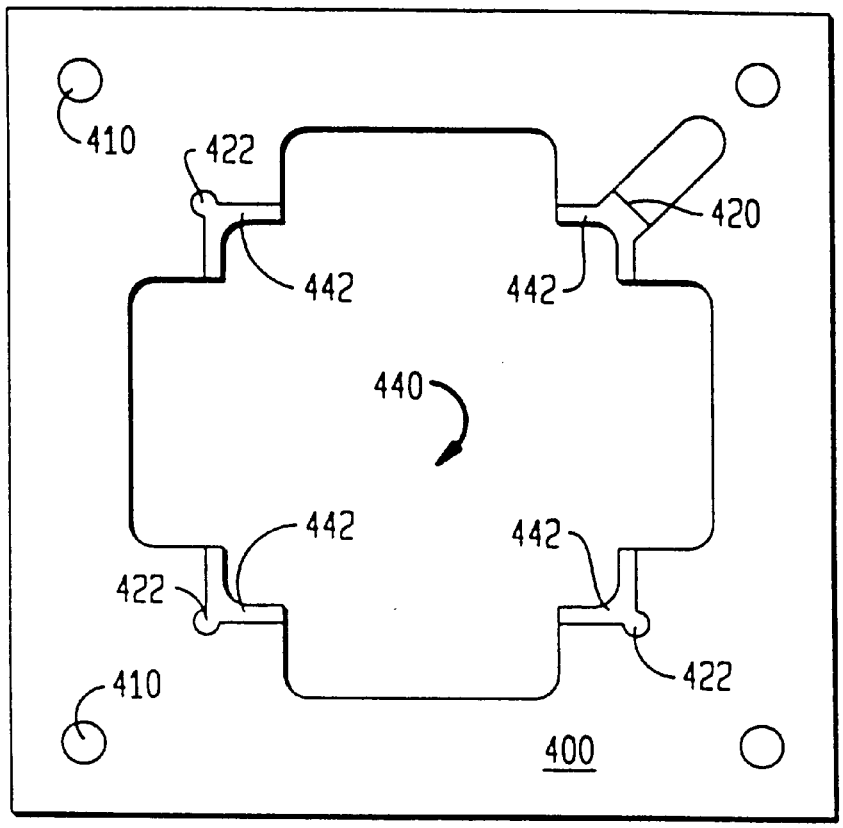
FIG. 4a is a plan view of a component of the embodiment of the test fixture shown in FIG. 2b.
Figure 4B:
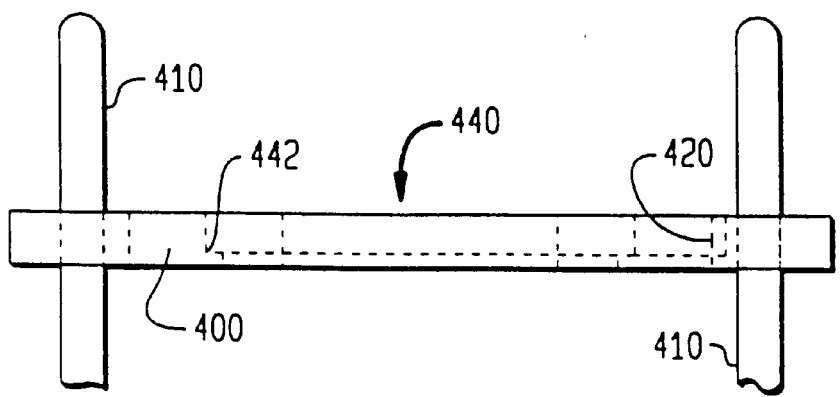
Figure 6A:
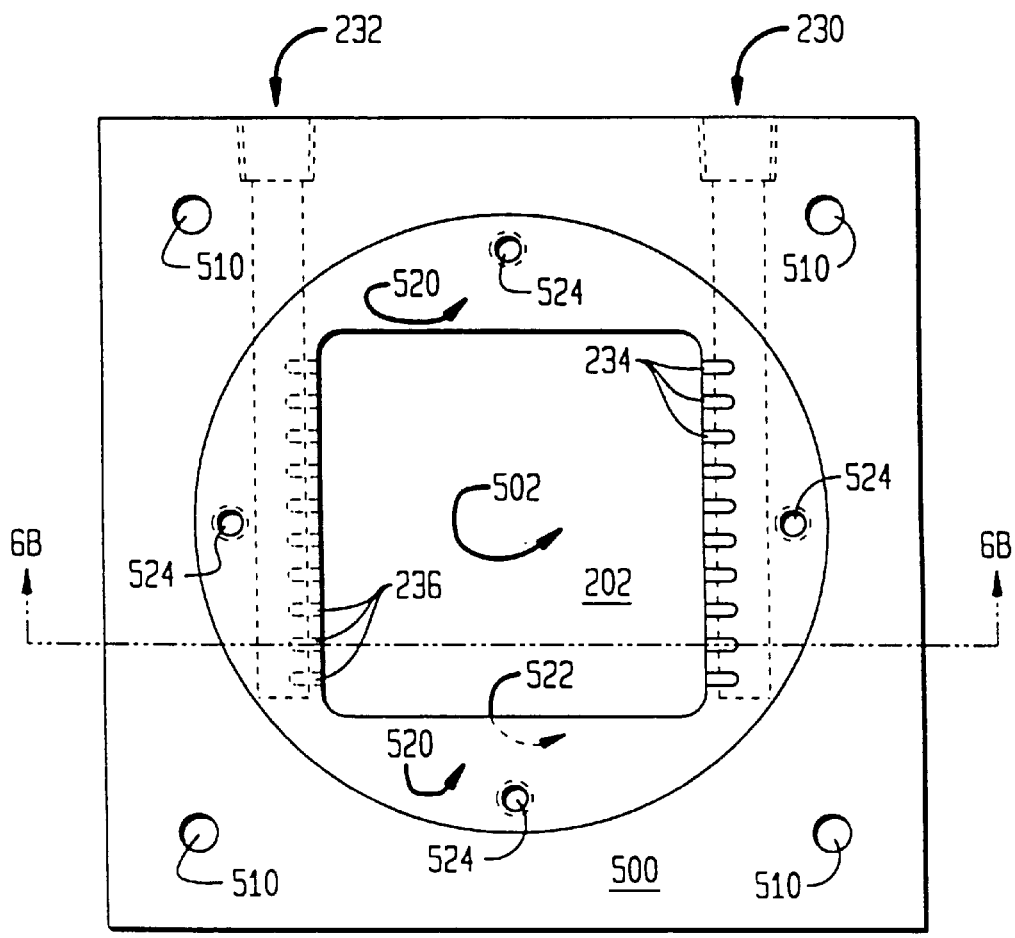
FIGS. 6a and 7a are plan views of components of the embodiment of the test fixture shown in FIG. 2b.
Figure 6B:
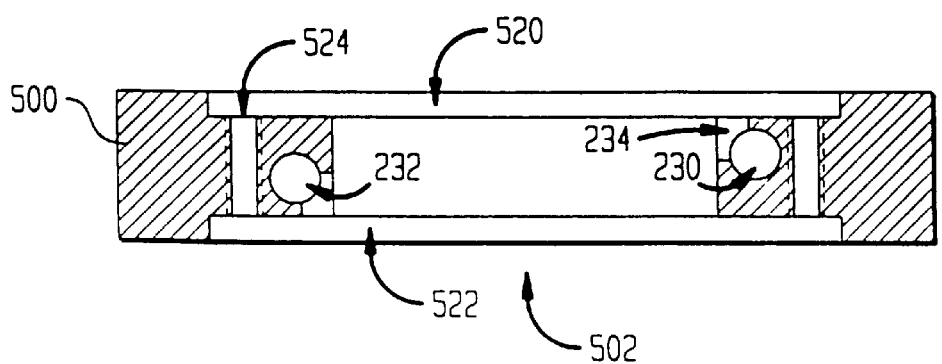
FIGS. 6b and 7b are side views of the components of the embodiment of the test fixture shown in FIGS. 6a and 7a, respectively.

Referring now to FIGS. 3b, 4a and 4b, a frame or anvil member 400 rides on posts 410, which are mounted in vessel body 500 (see FIGS. 6a and 6b). Anvil 400 is preferably held about 0.15 inches (dimension 1020 in FIG. 3b) above vessel 200 on springs 452. Springs 452 preferably encircle posts 410. Posts 410, in addition to engaging anvil 400, also engage mating holes 412 (FIG. 2a) of test head 260 to establish and maintain alignment of the test head 260 and anvil 400. The holes 412 are preferably fitted with ball bushings 414 (FIG. 2b) to reduce friction against posts 410. Suitable ball bushings are available from Thomson Industries, Inc. of Manhasset N.Y. Posts 410 are preferably made of rod stock also from Thomson Industries. Anvil 400 is preferably made of a material that isolates the tray from the vessel body, both thermally and electrically. Again, DuPont Vespel® is a suitable material.

Anvil 400 also has features to mount and align tray 300 and bring the COS assemblies 100, 102 in the tray into contact with temperature controlled pins 700. The center portion 440 of anvil 400 is cut out for temperature controlled pins 700 to project through. Around the edge of cut out 440 are four recessed lands 442 on which tray 300 rests. One corner 420 of one of lands 442 is bevelled. The other three corners 422 are square or may be machined with a slight radius as shown in FIG. 4a.

Figure 5A:
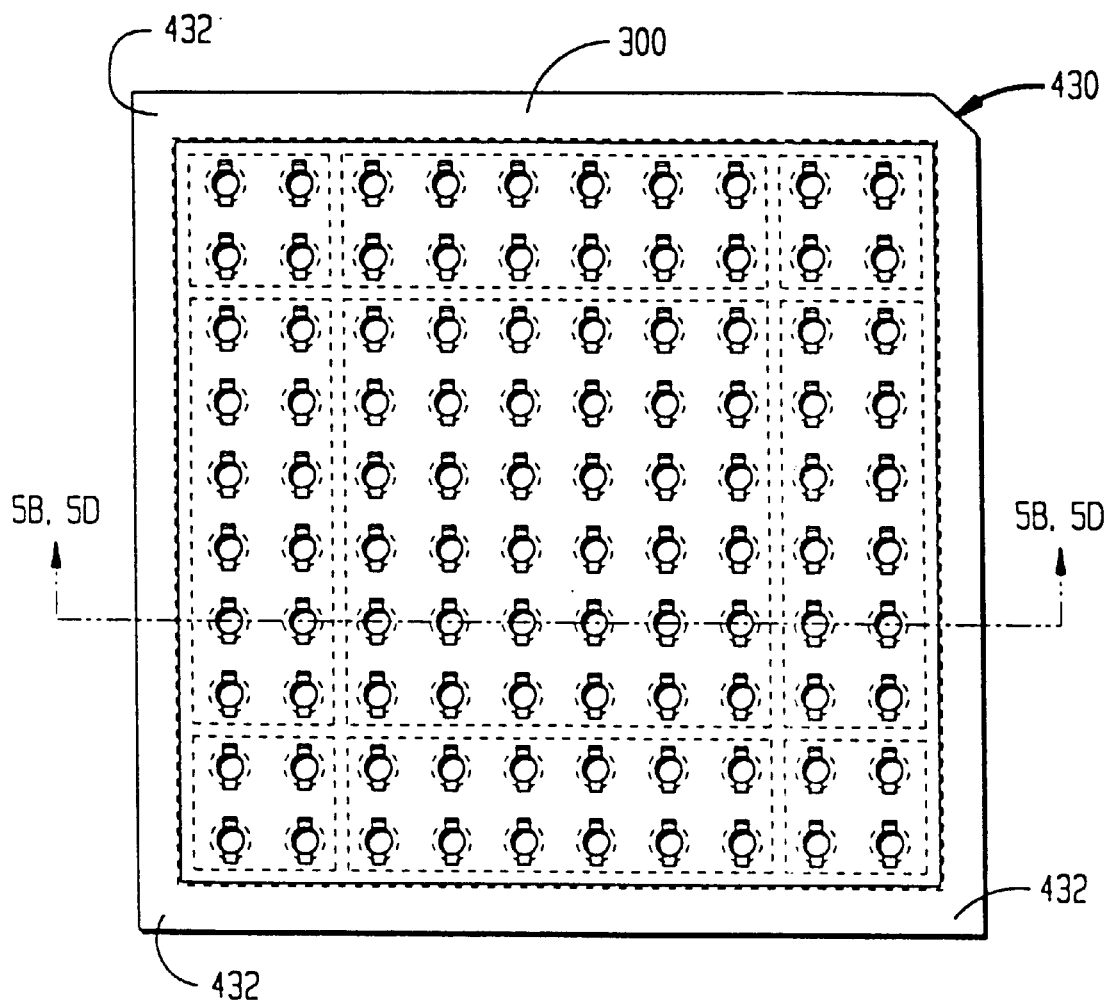
FIG. 5a is a plan view of an embodiment of a tray for holding semiconductor chips of the invention.
Figure 5B:
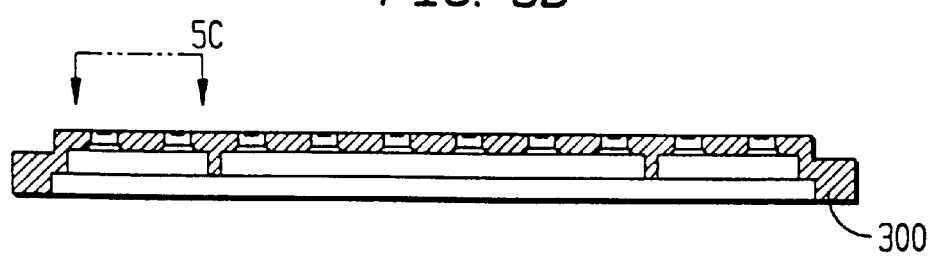
Figure 5C:
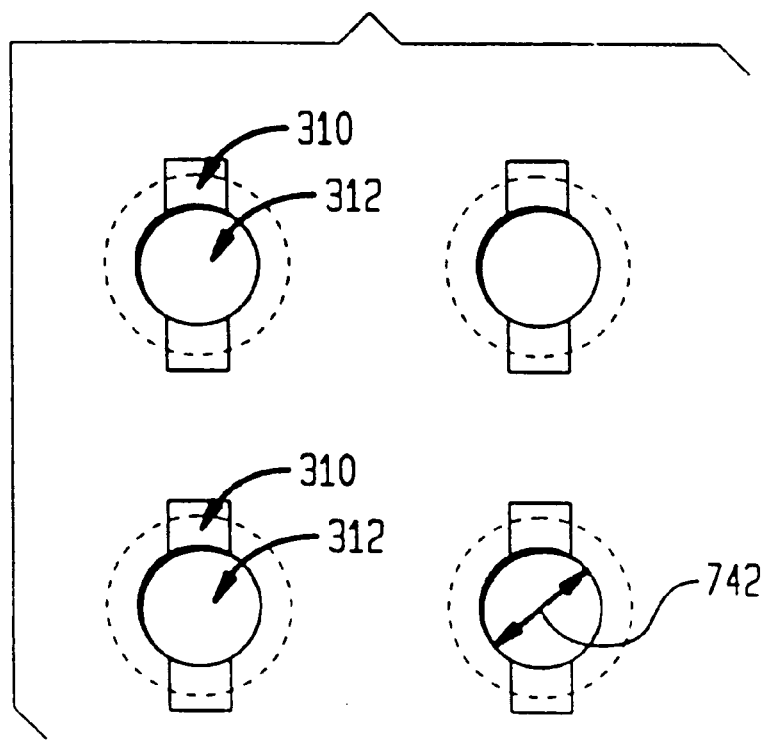
Figure 5D:
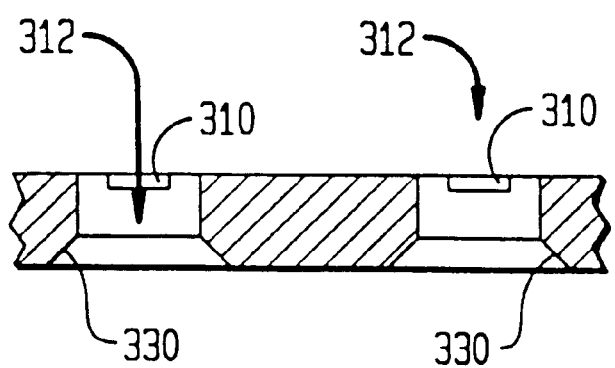
FIG. 5d is a side view of the detail of the embodiment of the tray shown in FIG. 5c.

Referring now to FIGS. 5a–5d, waffle pack tray 300 is shown. Corresponding to the bevelled corner 420 of anvil 400, one corner 430 of tray 300 is beveled, while the other three corners 432 are squared (see FIG. 2a). This keys the tray 300 for alignment in anvil 400 and prevents insertion of tray 300 into anvil 400 in an improper rotational position. Tray 300 is preferably formed of aluminum. The dimensions of pockets 310 are quite closely controlled to closely embrace the COS assemblies 100, 102. For ease of tray fabrication, it may be desirable to form the pockets with excess-radius corners, similar to the corners 422 of anvil 400 as shown in FIG. 4a, rather than with square corners as shown in FIG. 5a. The spacing between pockets 310 is in close agreement and tolerance with the spacing of electrodes 110 in test head 260. The bottoms of holes 312 are countersunk 330 to allow tray 300 to settle over pins 700. A tray similar to that described is available from Fluoroware Inc. of Chaska, Minn. The tray is preferably formed of aluminum because it is stable at temperatures to and above 100° C., with no melting or off-gassing.

Figure 7A:
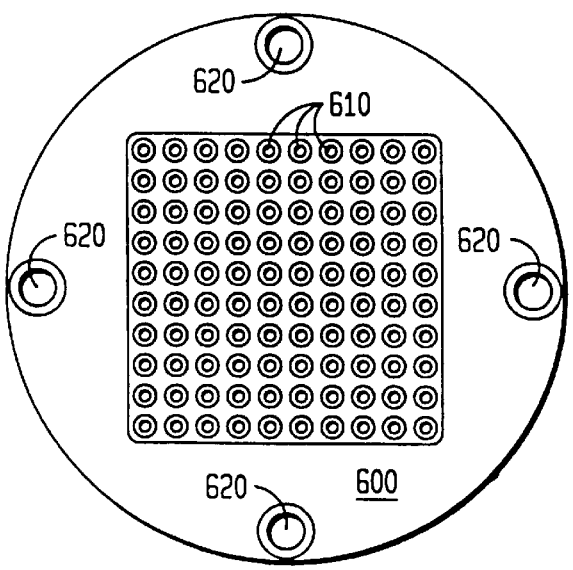
Figure 7B:
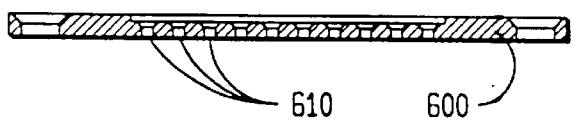

Referring to FIGS. 6a and 6b, the body of vessel 200 constitutes a block 500 with preferably a square center cutout 502, which forms vessel cavity 202. Ports 230 and 232 are preferably drilled in from one end and the corresponding ducts 234, 236 are preferably formed by sawing or drilling in from center cutout 502. Preferably nine ducts 234, 236 on each side of vessel cavity 202 line up with the gaps between the ten rows of temperature controlled pins 700, so that the flow of coolant through vessel cavity 202 is preferably quite uniform (e.g. without any deliberate swirling) and the respective temperature controlled pins 700 are maintained at a nearly uniform temperature. The vessel 200 may be placed in an insulating enclosure to further preserve the temperature of the temperature controlled fluid. Throughbores 510 receive posts 410 (FIGS. 4a and 4b) to align the anvil 400 and vessel 200. Circular recesses 520, 522 receive the top and bottom cover plates 600 (FIGS. 7a and 7b). Tapped throughbores 524 receive screws to hold cover plates 600 in place.

Referring to FIGS. 7a and 7b, two identical circular plates 600 form the top and bottom of vessel cavity 202. In the 10×10 preferred embodiment of the test fixture of the invention, one hundred holes 610 perforate each plate 600 for the temperature controlled pins 700 to project through. Preferably, each hole 610 is countersunk, so that the temperature controlled pin 700/plate 600 joints can be sealed. A suitable self-leveling silicon rubber sealant is available from General Electric Co. of Waterford, N.Y. under the tradename RTV-160. Four countersunk holes 620 permit attachment of cover plates 600 to vessel body block 500.

Figure 8:
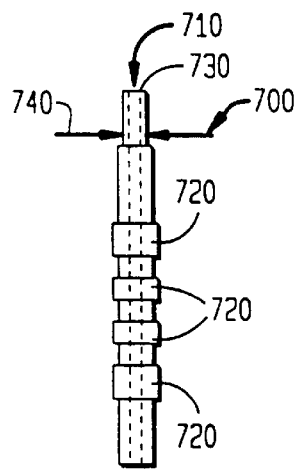
FIGS. 8 and 9 are side views of components of the embodiment of the test fixture of the invention.

Referring to FIG. 8, a temperature controlled pin 700 is shown. Temperature controlled pins 700 are preferably copper rods with pores 710. Pores 710 preferably have a diameter of 0.013 inches. Rings 720 are machined into temperature controlled pins 700 to increase the surface area of the pins 700 in contact with the temperature controlled liquid moving through the cavity 202 in vessel 200 so as to increase the thermal transfer between the temperature controlled liquid and pins 700 (see FIG. 2a). Top surface 730 is preferably flat and square with the axis of pin 700. Outer diameter 740 of pin 700 and the inner diameter 742 of hole 312 in tray 300 (FIG. 5c) are preferably approximately 0.06 inches in diameter and are configured so that pin 700 nearly fills hole 312 and achieves large thermal contact with submount 102 (FIG. 1). The temperature controlled pins 700 are of a low thermal mass, and of a material with high thermal conductivity such as copper so as to have quick temperature response when the temperature of the temperature controlled liquid changes.

Figure 9:
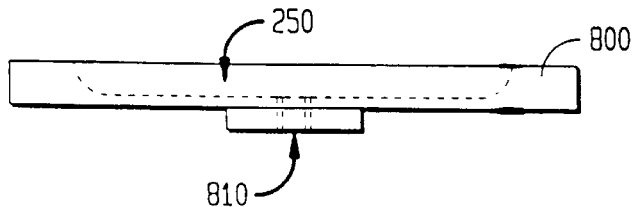

Referring to FIG. 9, bottom cover plate 800 is shown. Cover plate 800 has a cross section that seals against the bottom of vessel 200 around the edges and is hollowed in the center to form a vacuum cavity 250 against the bottom of vessel 200. Vacuum is drawn in the direction of arrow 802 (FIG. 2b) through hole 810 through the center of cover plate 800. Without such a vacuum, the COS assemblies 100, 102 may stick to the electrodes 110 or roll off the top of temperature controlled pins 700. A sufficient vacuum is drawn so that even if only one chip is being tested and the other ninety-nine positions are open "leaks," the one chip is held securely.

Figure 10:
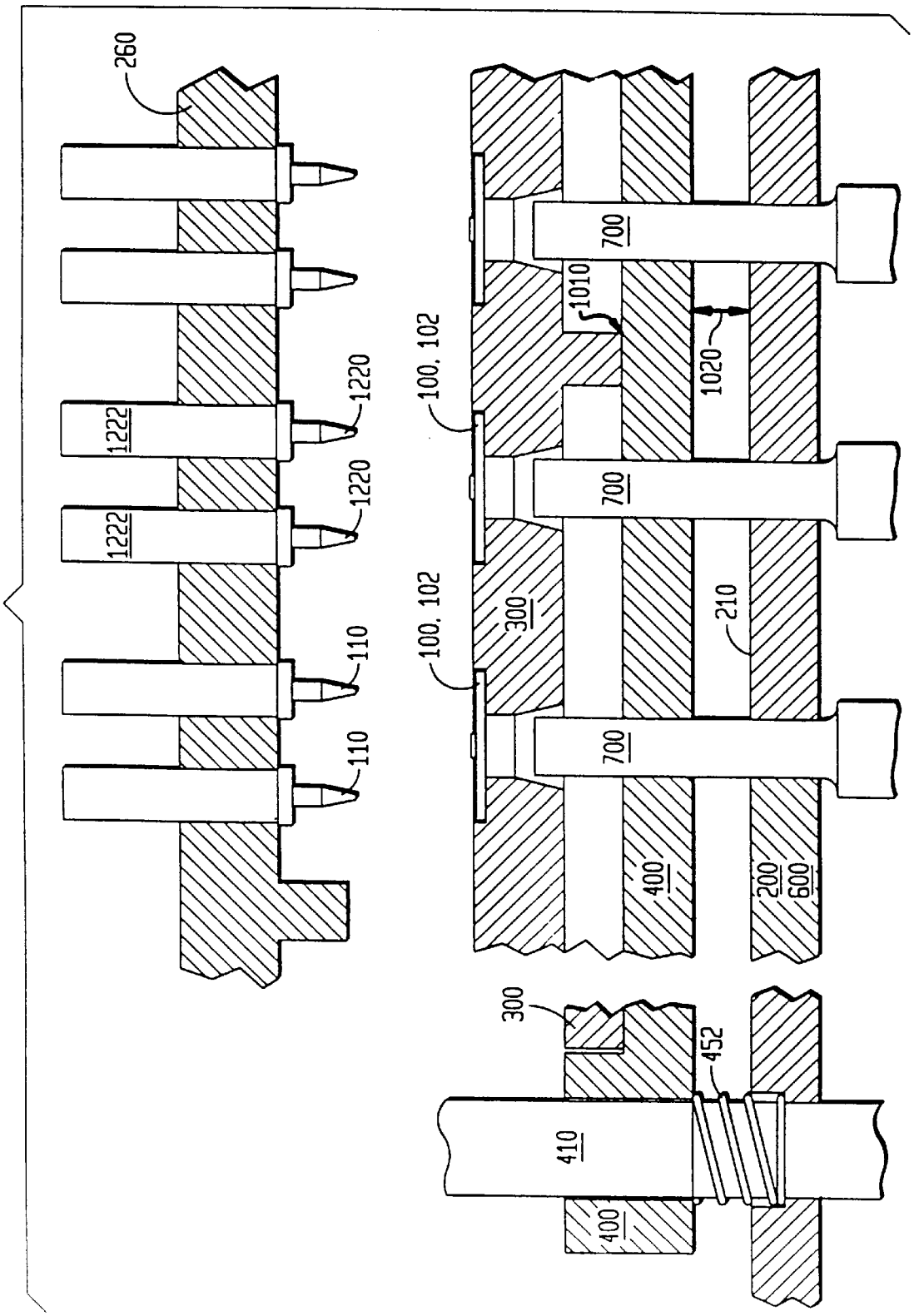
FIGS. 10–12 are detail views of components of the embodiment of the test fixture of the invention in operation.
Figure 11:
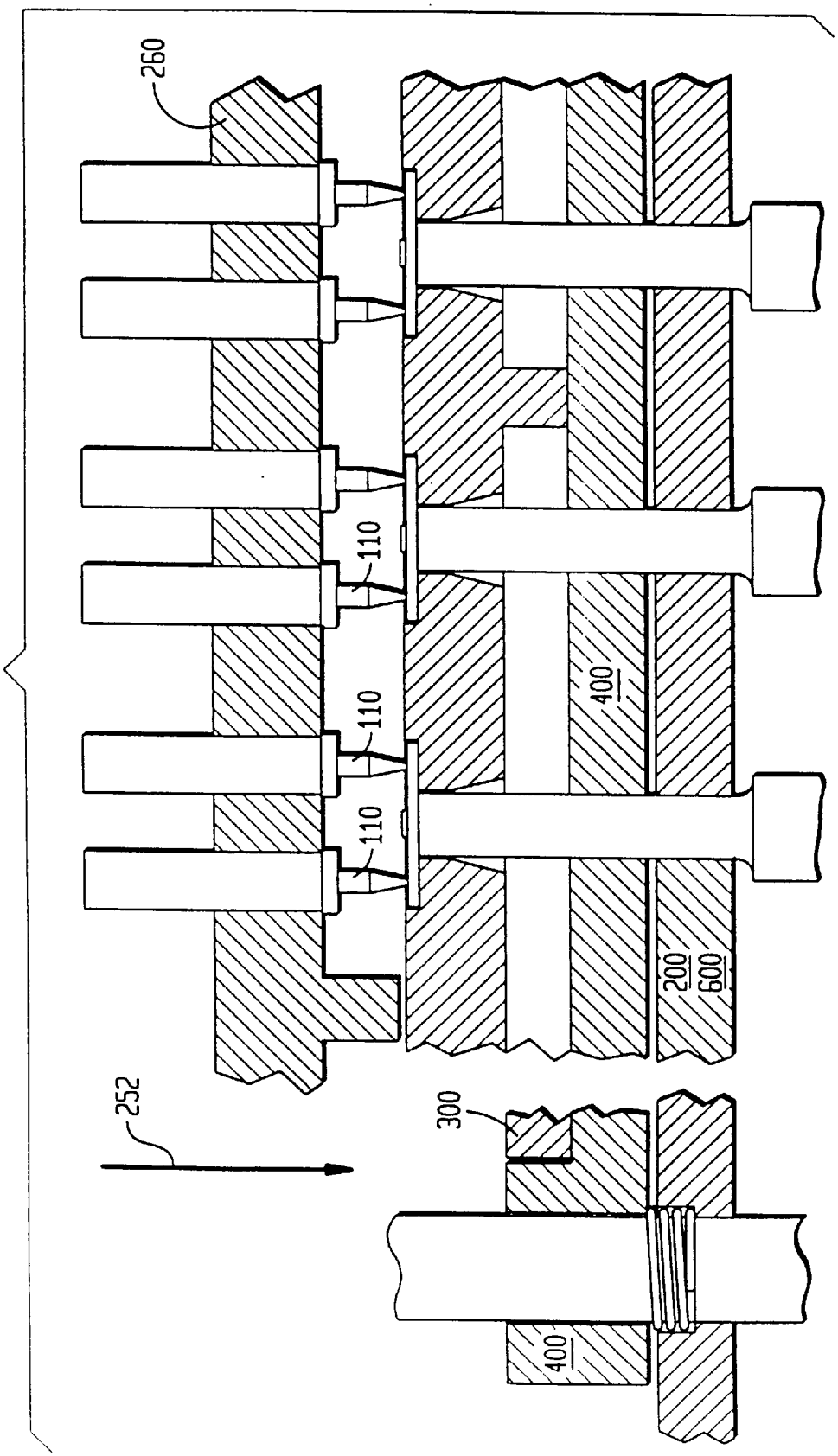
Figure 12:
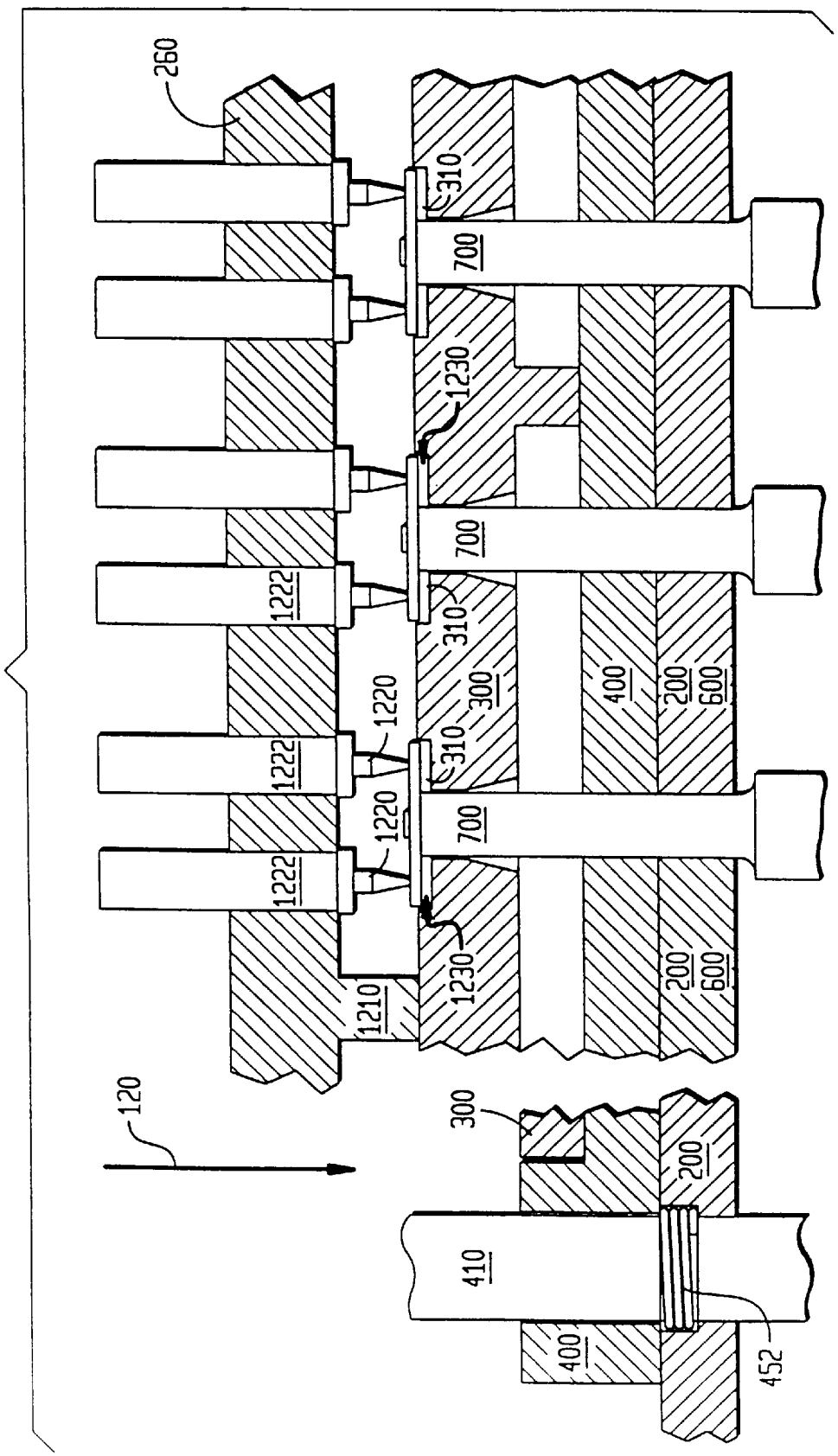

FIGS. 10–12 show the interaction of electrodes 110, COS assemblies 100, 102, tray 300, temperature controlled pins 700 and anvil 400 when the embodiment of the test fixture of the invention is in operation. Referring to FIG. 10, when a tray 300 loaded with COS assemblies 100, 102 is first placed in the test fixture, tray 300 rests on anvil 400 at contact point 1010. Anvil 400 floats above top surface 210 of vessel 200, suspended by springs 452. Referring now to FIG. 11, as test head 260 is lowered in the direction of arrow 252 (see FIG. 2a), electrodes 110 contact COS assemblies 100, 102. A vacuum is drawn through pores 710 in the temperature controlled pins 700 to hold the COS assemblies in place as the electrodes 110 are brought into contact with COS assemblies 100, 102. Referring now to FIG. 12, as test head 260 is lowered further, feet 1210 of head 260 contact tray 300 and depress tray 300 in the direction of arrow 120 toward vessel 200 (see FIG. 1) by compressing springs 452. Because the temperature controlled pins 700 are mounted in vessel 200, pins 700 lift COS assemblies 100, 102 up out of the pockets 310 in tray 300. The COS assemblies are preferably lifted about 0.006 inches out of pockets 310 as shown by gap 1230. Plungers 1220 of electrodes 110 resiliently compresses into their bodies 1222. The spring tension thus induced ensures good electrical contact between electrodes 110 and chips 100. To perform a purge test using a common constant current to all semiconductor chips, a bias current may be supplied to the chips using a programmable common voltage supply and a 20 ohm 1% tolerance series resister. When testing is complete, test head 260 is raised. As the test head 260 is raised, vacuum is drawn through pores 710 (FIG. 8) to keep the COS assemblies 100, 102 from sticking to the electrodes 110.

Figure 13:
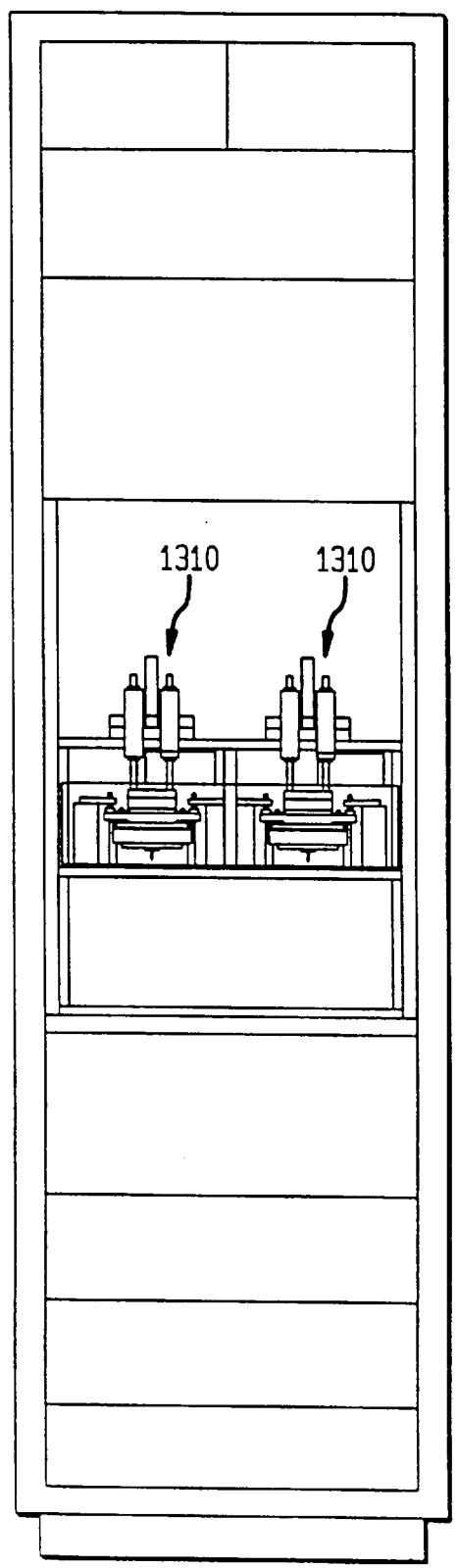
FIG. 13 is a front view of an embodiment of an apparatus of the invention.

Referring to FIG. 13, multiple testing fixtures, capable of operating independently, can be installed side-by-side, preferably at walk-up height. In the preferred embodiment for testing laser chips, the electronics are mounted above and below the test fixtures in a standard 19 inch wide rack. Mounted below the test fixtures are a voltage source for the temperature controllers, a digital volt meter for measuring the outputs of the chips under test, two power supplies for the chips to be tested and a switch panel. Mounted above the test fixtures are a scanner to multiplex the digital volt meters. Suitable components are a voltage source for the temperature controllers sold by Keithley Instruments of Cleveland, Ohio as model no. 213, a digital volt meter sold by Keithley Instruments as model no. 199 DMM, power supplies sold by Hewlett-Packard Co. of Palo Alto, Calif. as model no. 6651A, a scanner sold by Keithley Instruments as model no. 706, and a bath temperature controller sold by Neslab Instruments, Inc. as model no. EX-110.

Figure 14:
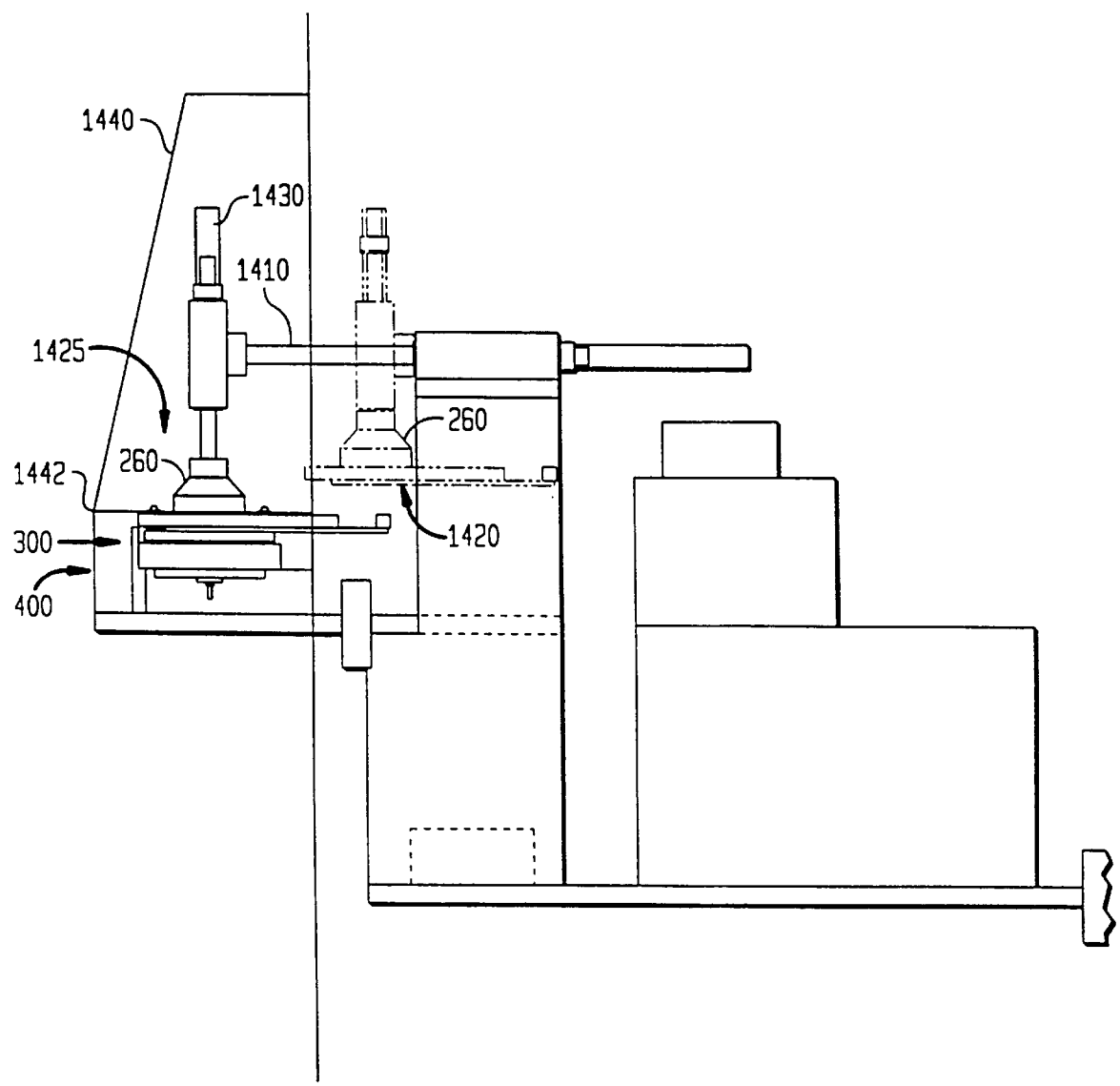
FIG. 14 is a side view of the embodiment of the apparatus of the invention.

Referring to FIG. 14, test head 260 may be mounted on an automated horizontal slide arm 1410. In a retracted position 1420, anvil 400 of the test fixture is exposed to accept a tray 300 full of COS assemblies 100, 102. Slide arm 1410, by suitable hydraulic, electrical, mechanical or pneumatic means, may be extended into a service position to place test head 260 over the test fixture. A second vertical slide arm 1430 actuates to lower test head 260 as shown in FIGS. 10–12. Trays full of chips to be tested are placed in the test fixtures through door 1440 which opens about hinge 1442 and which covers the test area to provide a controlled temperature environment, to prevent dust contamination, and to protect a human operator. Door 1440 is preferably interlocked to the electronics so that no dangerous voltages, laser light or mechanical motion will be present when the door is open.

Figure 15:
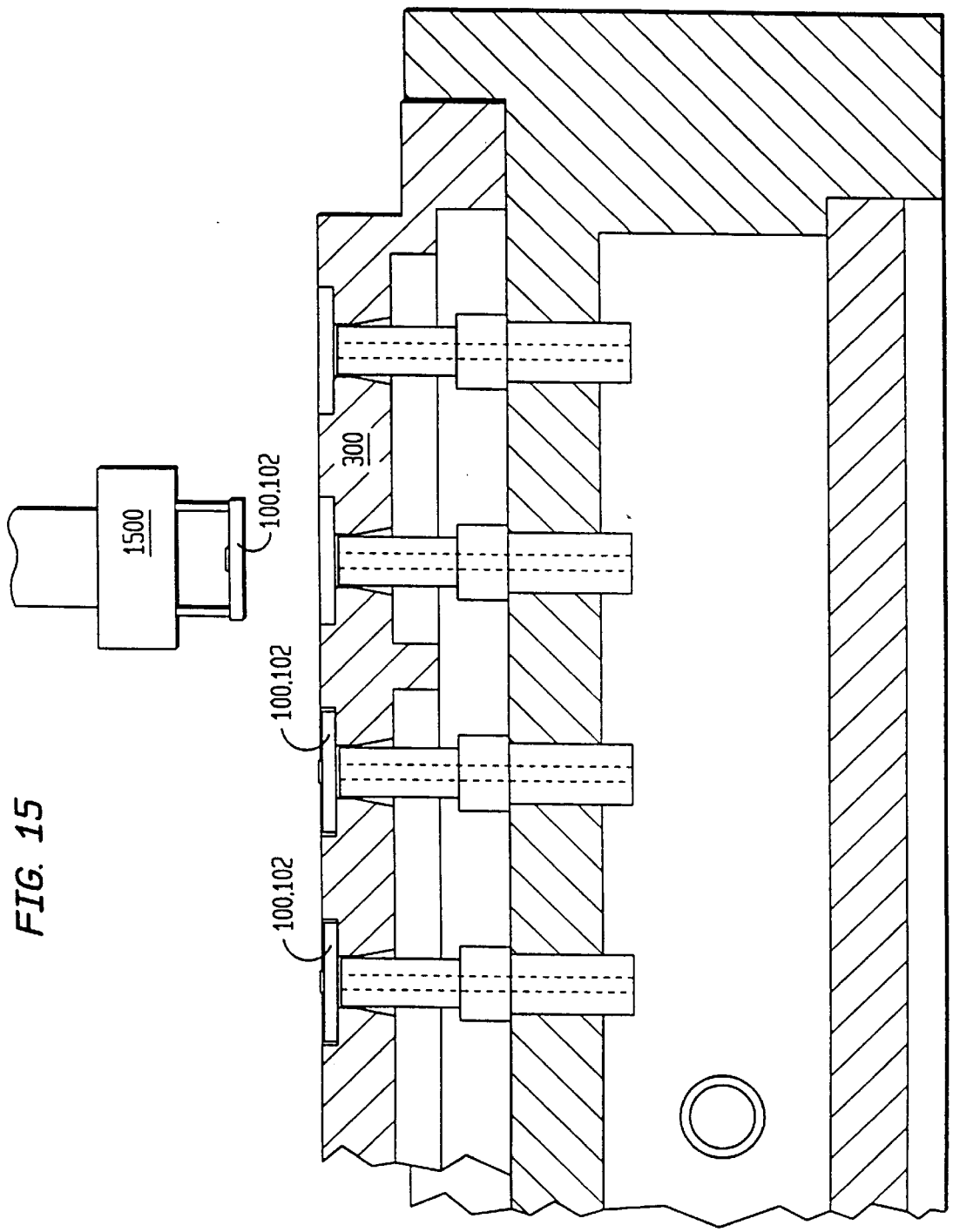
FIG. 15 is a detail view of components of an embodiment of the invention in operation.

Referring to FIG. 15, an automated pick-and-place head 1500 is shown. Pick-and-place head 1500 may be used to pick-up COS assemblies 100, 102 and load them into tray 300 before testing and/or pick-up COS assemblies 100, 102 and unload them out of tray 300 after testing.

EXAMPLE

Figure 16A:
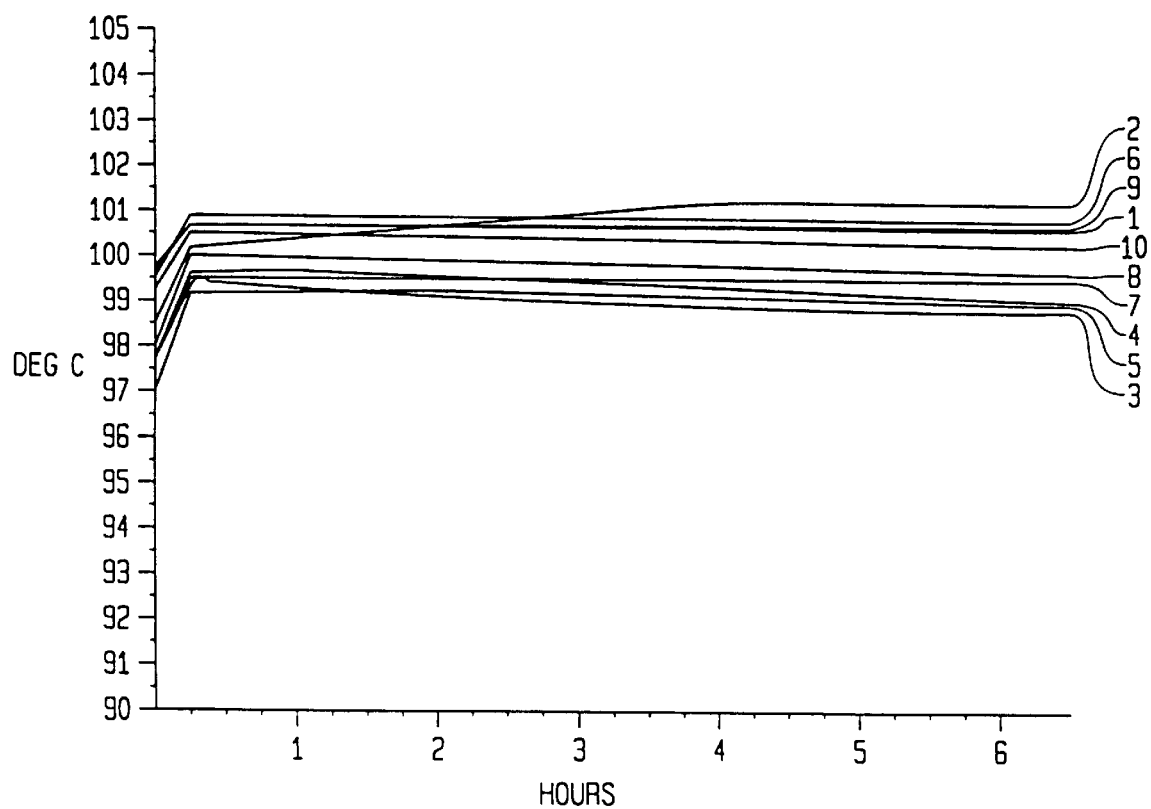
FIG. 16a is a plot of temperatures of tested chips.
Figure 16B:
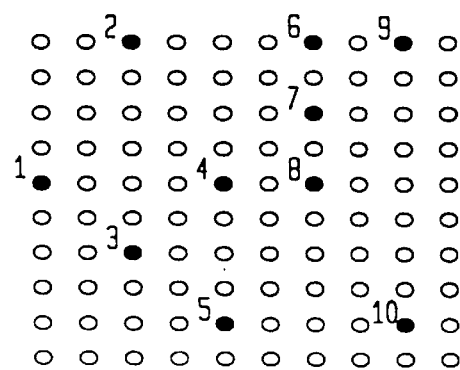

Referring to FIGS. 16a and 16b, a prototype of the invention was constructed and tested on laser chips to ensure that a tight temperature tolerance could be maintained during chip testing. Performance was tested by monitoring submount temperatures of the laser chips at various positions in the tray during testing. For this test, type T thermocouples manufactured by Omega Engineering Inc. of Stanford, Conn. having a diameter of 0.05 inches were routed through access ports in the fixture to the submounts. The thermocouples were bonded to the top surface of the submounts using thermal grease which provided a thermally conductive, flexible bond between the thermocouple and the top surface of the submount.

The temperature controller was set to maintain the average submount temperature at 100° C. A bias current of 200 mA was applied. The chip submount temperatures were recorded at frequent intervals, initially 1 minute to 5 minutes, and then every hour after temperature stabilized.

Ninety-eight COS assemblies were tested, with ten of the devices monitored for submount temperature. FIG. 16b is a schematic representation of the locations of the submounts monitored (ten positions were monitored within the 10×10 chips array) and FIG. 16a shows a plot of the temperatures of the ten monitored submounts against time. The COS assembly in monitored position 2 encountered a problem with the laser chip. The laser voltage of the chip at monitored position 2 increased from 1.4 V to 1.8 V during the first 4 hours. No problems with thermal or electrical contact were found with this device. Since the laser chips were not previously tested and test yield is typically 90%, a failure was not unexpected. Excluding the COS assembly at monitored position 2, the other nine tested chips stayed within the 100±1° C. requirement for purge testing as shown in FIG. 16.

It is to be understood that the above description is only of one preferred embodiment of the invention. Numerous other arrangements may be derived by one skilled in the art without departing from the scope of the invention. The invention is thus limited only as defined in the accompanying claims.

We claim:

1. A method comprising the steps of:

placing a plurality of semiconductor chips in a transport and alignment standard designed to receive said plurality of semiconductor chips and to facilitate electrical and thermal contacts with said semiconductor chips:

contacting said semiconductor chips with electrical contacts and thermal contacts while said chips are positioned in said transport and alignment standard;

wherein:

said thermal contacts are temperature controlled pins retained in a base;

said base comprises a vessel having a cavity for receiving a temperature controlled fluid; and said temperature controlled pins have portions that extend into said cavity and contact said temperature controlled fluid.

2. The method of claim 1, wherein:

said portions of said temperature controlled pins that extend into said cavity of said vessel and contact said temperature controlled fluid are configured with surface features that increase thermal exchange between said temperature controlled pins and said temperature controlled fluid.

3. The method of claim 2, wherein:

said surface features to increase thermal exchange between said temperature controlled pins and said temperature controlled fluid are rings on said temperature controlled pins.

4. The method of claim 1 wherein:

said vessel has an inlet port and an outlet port to allow said temperature controlled fluid to flow through said cavity, said inlet and outlet ports being configured to provide a relatively uniform flow of said temperature controlled fluid through said cavity.

5. The method of claim 1, wherein:

said temperature controlled pins have vacuum drawing pores.

6. The method of claim 1 wherein:

said vessel is formed from a body, a first cover and a second cover;

said body has a through-bored opening, the opening being of cross section at least as large as the area occupied by semiconductor chips as positioned by the transport and alignment standard, the body further defining inlet and outlet ports;

said first and second covers cover said opening, said covers and opening defining a cavity for circulation of a thermally controlled fluid from said inlet port to said outlet port, and said first and second covers have holes to receive said temperature controlled pins;

said temperature controlled pins have first and second ends that extend through said holes in said first and second covers of said vessel;

said first ends of said temperature controlled pins are configured to thermally contact said semiconductor chips and said second ends of said temperature controlled pins extend into said vacuum chamber.

7. The method of claim 1, wherein:

said transport and alignment standard is a tray;

a spring biased anvil member is resiliently attached to said base for receiving said tray; and movement of said electrical contacts into contact said semiconductor chip depresses said anvil member, bringing said temperature controlled pins into contact with said semiconductor chip.

8. The method of claim 1, wherein:

said vessel is formed of a material that is thermally insulating.

9. The method of claim 7, wherein:

a head mounting said electrical contacts is moved on an arm from a withdrawn position to an engaged testing position.

10. The method to claim 9, wherein:

a pick and place head is configured to pick up said semiconductor chips and place said semiconductor chips in said pockets in said tray.

11. A method comprising the steps of:

placing a plurality of semiconductor chips in a transport and alignment standard designed to receive said plurality of semiconductor chips, to carry said chips into a thermally-controlled testing station of a chip manufacturing process, and to hold said semiconductor chips aligned in said station to facilitate electrical and thermal contacts with said semiconductor chips, the electrical and thermal contacts not connected to said transport and alignment standard;

contacting said semiconductor chips with electrical contacts and thermal contacts while said chips are held aligned by in said transport and alignment standard electrical contacts driving the chips into an operative condition, and said thermal contacts controlling the operating temperatures of the chips.

12. The method of claim 11, wherein:

electrodes retained in a head are configured to be brought into said electrical contact with the semiconductor chips;

a vessel comprises a block and cover, said block having an opening therein, said cover covering said opening, said cover and block together defining a cavity with an inlet port and an outlet port for circulation of a thermally controlled fluid; and a plurality of temperature controlled pins project through said cover and are configured to establish said thermal contact between said thermally controlled fluid and one of said semiconductor chips as the chip is held in place relative to said pin.

13. The method of claim 12, wherein:

said inlet port and said outlet port are configured to provide nearly uniform flow of said temperature controlled fluid through said cavity.

14. The method of claim 12, wherein the transport and alignment standard is a tray configured to receive said plurality of semiconductor chips, and to retain said semiconductor chips in registration with said electrical contacts and thermally conductive pins.

15. The method of claim 14, wherein:

said temperature controlled pins have vacuum drawing pores.

16. The method of claim 15, wherein:

said vessel opening of said block extends through said block, the two ends of the opening covered by said cover and a second cover, respectively;

a vacuum cover is disposed over said second cover of said vessel forming a vacuum chamber between said vacuum cover and said second cover;

said temperature controlled pins have first and second ends that extend through holes in said first and second covers of said vessel;

said first ends of said temperature controlled pins are configured to contact said semiconductor chips and said second ends of said temperature controlled pins extending into said vacuum chamber; and said vacuum drawing pores of said temperature controlled pins extend through said temperature controlled pins from said first ends to said second ends thereof whereby a vacuum in said vacuum chamber causes a vacuum to be drawn through said vacuum drawing pores and said semiconductor chips to be drawn toward said first ends of said temperature controlled pins.

17. The method of claim 12, wherein:

said vessel is formed a material that is thermally insulating.

18. The method of claim 12, wherein each of said thermally conductive pins is a distinct thermal mass relatively insulated from others of said thermally conductive pins.

19. The method of claim 18, wherein:

said portions of said temperature controlled pins that extend into said cavity of said vessel and contact said temperature controlled fluid are configured with surface features that increase thermal exchange between said temperature controlled pins and said temperature controlled fluid.

20. The method of claim 19, wherein:

said surface features to increase thermal exchange between said temperature controlled pins and said temperature controlled fluid are rings on said temperature controlled pins.

21. The method of claim 12, wherein said opening extends through said block to a bottom opening;

said bottom opening is covered by a bottom cover; and said thermally conductive pins project through said bottom cover.

22. The method of claim 11, wherein:

the step of placing said semiconductor chips in said transport and alignment standard comprises placing said semiconductor chips in a tray having pockets formed in an upper surface thereof to receive said semiconductor chips and holes extending therethrough to receive said thermal contacts.

23. The method of claim 22, wherein:

said electrical contacts are retained in a head; and said thermal contacts are temperature controlled pins retained in a base.

24. The method of claim 11, further comprising the step of:

contacting said thermal contacts with a temperature controlled fluid.

25. The method of claim 24, wherein:

the step of contacting said temperature controlled pins with said temperature controlled fluid comprises passing a temperature controlled fluid through a vessel in said base having a cavity and contacting portions of said temperature controlled pins extending into said cavity with said temperature controlled fluid, a flow of said fluid being configured and controllable to maintain the chips at a specified temperature.

26. The method of claim 24, wherein
each of said thermal contacts is a distinct thermal mass relatively insulated from others of said thermal contacts.

27. The method of claim 26, wherein
said thermal contacts are configured with surface features to increase thermal exchange between said thermal contacts and said fluid.

28. The method of claim 24, wherein
a circulation pattern of said fluid has a relatively uniform flow velocity throughout a region of thermal exchange with said thermal contacts.

29. The method of claim 11, further comprising the step of:
drawing a vacuum through a pore in said thermal contacts.

30. The method of claim 11, further comprising the step of:
depressing a spring biased anvil member that is resiliently attached to said base to bring said electrodes into contact with said semiconductor chips and said temperature controlled pins into contact said semiconductor chips.

31. The method of claim 30, further comprising the step of exerting a force to lift said semiconductor chips out of thermal and electrical contact with said transport and alignment standard.

32. The method of claim 30, further comprising, essentially simultaneously with the depressing, removing the semiconductor chips from thermal contact with the tray by moving the tray relative to the chips.

33. The method of claim 11, further comprising the step of:
testing said semiconductor chips by simultaneously passing an electrical current through said electrodes and said chips, and contacting said semiconductor chips with said thermal contacts.

34. The method of claim 33, further comprising the step of:
using a pick and place head at said loading position to pick up said semiconductor chips and place said semiconductor chips in said pockets in said transport and alignment standard.

35. The method of claim 33, further comprising the step of:
using a pick and place head at said unloading position to pick up said semiconductor chips and remove said semiconductor chips from said pockets in said transport and alignment standard.

36. The method of claim 11, wherein
said transport and alignment standard is a tray configured to facilitate transport of said semiconductor chips in a chip manufacturing process.

37. The method of claim 36, wherein:
a spring biased anvil member is resiliently attached to said base for receiving the tray, the tray having pockets to receive said semiconductor chips;
said head is movable from a first position to a second position; and
movement of said head from said first position to said second position causes said electrodes to contact said semiconductor chips, said head to contact and depress said anvil member and said temperature controlled pins to thermal contact said semiconductor chips and lift said semiconductor chips out of said pockets.

38. The method of claim 36, wherein:
said thermal contacts are temperature controlled pins and are retained in a base;
said base comprises a vessel having a cavity for receiving a temperature controlled fluid; and
said temperature controlled pins have portions that extend into said cavity and contact said temperature controlled fluid.

39. The method of claim 38, wherein:
said vessel is formed from a body, a first cover and a second cover;
said body has a through-bored opening, the opening being of cross section at least as large as the space occupied by the semiconductor chips as positioned by the tray, the block further defining inlet and outlet ports;
said first and second covers cover said opening, said covers and opening defining a cavity for circulation of a thermally controlled fluid from said inlet port to said outlet port, and said first and second covers have holes to receive said temperature controlled pins;
said temperature controlled pins have first and second ends that extend through said holes in said first and second covers of said vessel; and
said first ends of said temperature controlled pins are configured to thermally contact said semiconductor chips and said second ends of said temperature controlled pins extending into said vacuum chamber.

40. The method of claim 39, wherein
said vessel is configured to flow said temperature controlled fluid past said temperature controlled pins without induced swirl.

41. The method of claim 36, wherein:
a spring biased anvil member is resiliently attached to said base for receiving said tray, configured to resiliently deform to bring said electrical contacts into contact said semiconductor chips, and to bring said temperature controlled pins into contact with said semiconductor chips.

42. The method of claim 11, wherein the step of contacting said semiconductor chips with said contacts further comprises removing the semiconductor chips from thermal contact with the tray by moving the tray relative to the chips.

43. The method of claim 1, wherein:
said vessel is configured to flow said temperature controlled fluid past said temperature controlled pins without induced swirl.

* * * * *